United States Patent
Sugie et al.

(10) Patent No.: US 7,557,557 B2
(45) Date of Patent: Jul. 7, 2009

(54) CURRENT DETECTION CIRCUIT, LOAD DRIVE CIRCUIT, AND MEMORY STORAGE

(75) Inventors: Hisashi Sugie, Kyoto (JP); Yutaka Sasamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 352 days.

(21) Appl. No.: 10/598,360

(22) PCT Filed: Jan. 27, 2005

(86) PCT No.: PCT/JP2005/001566

§ 371 (c)(1), (2), (4) Date: Aug. 25, 2006

(87) PCT Pub. No.: WO2005/085879

PCT Pub. Date: Sep. 15, 2005

(65) Prior Publication Data

US 2008/0231246 A1 Sep. 25, 2008

(30) Foreign Application Priority Data

Mar. 3, 2004 (JP) .............................. 2004-058571
Mar. 3, 2004 (JP) .............................. 2004-058573

(51) Int. Cl.
*G05F 3/20* (2006.01)
*G05F 1/573* (2006.01)

(52) U.S. Cl. ...................................... 323/316; 323/277

(58) Field of Classification Search .................. 323/282, 323/284, 285, 273, 277, 312, 316, 351
See application file for complete search history.

(56) References Cited

U.S. PATENT DOCUMENTS 6,424,131 B1 * 7/2002 Yamamoto et al. .......... 323/282
7,106,042 B1 * 9/2006 Jackson ...................... 323/316

FOREIGN PATENT DOCUMENTS

| JP | 02-157917 A | 6/1990 |
|---|---|---|
| JP | 07-113826 A | 5/1995 |
| JP | 08-086818 A | 4/1996 |
| JP | 2570523 B2 | 10/1996 |
| JP | 09-049858 A | 2/1997 |
| JP | 11-299292 A | 10/1999 |
| JP | 2003-174766 A | 6/2003 |

OTHER PUBLICATIONS

International Search Report issued in the corresponding International Application No. PCT/JP2005/001566, mailed on May 31, 2005.

* cited by examiner

*Primary Examiner*—Jessica Han
*Assistant Examiner*—Emily Pham
(74) *Attorney, Agent, or Firm*—Keating & Bennett, LLP

(57) ABSTRACT

A stable high-precision current detection circuit capable of continuously detecting load current through a load with extremely reduced power loss. The current detection circuit has a power transistor and a current detection transistor that are fed with a common power supply voltage and a common switching signal. A buffer circuit is provided for supplying an idling current to the output node of the current detection transistor while realizing the same virtual potential at the output terminals of these transistors. Thus, the buffer circuit always functions as a class-A amplifier.

13 Claims, 11 Drawing Sheets

CURRENT DETECTION CIRCUIT, LOAD DRIVE CIRCUIT, AND MEMORY STORAGE

TECHNICAL FIELD

This invention relates to a stable high-precision current detection circuit for detecting current flowing through a load such as a spindle motor of a storage device such as an HDD and an FDD. The invention also relates to a load drive circuit utilizing an inventive current detection circuit, and a motor driven by such load drive circuit.

BACKGROUND ART

Commonly used current detection circuits for detecting the current flowing through a load controlled by a transistor employs a current detection resistor connected in series to the transistor or to the load to directly detect the current by measuring the voltage drop across the resistor, as disclosed in Japanese Patent Application Laid Open H11-299292 (hereinafter referred to as Patent Document 1) and 2003-174766 (referred to as Patent Document 2).

Another type of current detection circuit is also disclosed in, for example, Japanese Patent Application Laid Open No. 2570523 (referred to as Patent Document 3), in which constant current is passed through a current detection transistor while applying thereto the same control voltage as applied to the transistor connected to the load, and the output voltages of the respective transistors are compared to detect the level of the load current.

The conventional current detection circuits as disclosed in Patent Documents 1 and 2 inevitably suffers from (PWM) energy loss in the current detection resistors used, which lowers the power efficiency of the circuit. In addition, in a load drive circuit having a bridge circuit adapted to perform pulse-width modulated (PWM) driving of a load, the current detection circuit cannot perform current detection per se during off periods of the pulse width modulation (PWM).

Although the current detection circuit of Patent Document 3 is free of power loss by a current detection resistor, it cannot detect the load current continuously, since the circuit is intended to determine if the load current exceeds a predetermined level or not.

In view of such prior art problems, the present invention is directed to a high-precision current detection circuit capable of continuously detecting current in a stable manner with reduced power loss in the current detection. The invention is also directed to a load drive circuit utilizing such current detection circuit.

DISCLOSURE OF THE INVENTION

A current detection circuit in accordance with one aspect of the invention comprises: a first transistor for supplying load current to a load;

a current detection transistor having a control electrode receiving the same control signals as applied to the control electrode of the first transistor, the current detection transistor adapted to supply a proportional current that is proportional to the load current;

a buffer circuit having an idling current source for supplying a predetermined idling current to an output node of the current detection transistor, the buffer circuit adapted to equalize the output voltage of the first transistor with the voltage at the output node of the current detection transistor, and adapted to output a detection current that amounts to the sum of the proportional current and idling current, and a conversion circuit for converting into an output signal the detection current outputted from the buffer circuit.

A current detection circuit in accordance with another aspect of the invention comprises:

a current-controlling transistor having a control electrode and an output electrode connected to the control electrode;

a variable-current type control-current supplying current source for flowing controlled current through the current-controlling transistor;

a first transistor connected to the current-controlling transistor in a current mirror configuration for supplying load current to a load;

a current detection transistor connected to the current-controlling transistor in a current mirror configuration for supplying a proportional current that is proportional to the load current;

a buffer circuit having an idling current source for providing a predetermined idling current to the output node of the current detection transistor, the buffer circuit adapted to equalize the output voltage of the first transistor with the voltage at the output node of the current detection transistor, and adapted to output a detection current that amounts to the sum of the proportional current and the idling current; and a conversion circuit for converting into an output signal the detection current outputted from the buffer circuit.

The buffer circuit of the foregoing current detection circuits may have:

an amplifier fed with the output voltage of the first transistor and the voltage appearing at the output node of the current detection transistor; and a third transistor provided between the output node of the current detection transistor and the conversion circuit, and controlled by the output of the amplifier.

The power supply voltage supplied to the idling current source (the voltage hereinafter referred to as idling power supply voltage) may be equal to or higher than the voltage supplied to the first transistor (referred to as first power supply voltage) and the current detection transistor.

The current detection circuit may have a switching circuit in the idling current source and a comparator for generating a comparison output to switch off the switching circuit when the output signal exceeds a reference level.

The comparator may have a characteristic hysteresis having a predetermined hysteresis width.

Further, the current detection circuit may have:

a switching circuit provided in the idling current source and switched on by an idling signal; and a timing circuit for outputting the idling signal for a first predetermined period of time upon receipt of the control command signal and for outputting the control signal after a second predetermine time has elapsed since the receipt of the control command signal, the second predetermine time being shorter than the first predetermined time.

A load drive circuit for performing pulse-width modulated (PWM) driving of a single-/multi-phase load in accordance with still another aspect of the invention has at least two series circuits such that each of the series circuits includes: a first transistor coupled between a first power supply voltage and the output node connected to the load to supply load current to the load when switched on by a switching signal; and a second transistor coupled between a second power supply voltage and the output node and switched on and off by a PWM switching signal, and that the series circuits together form a single-/multi-phase bridge circuit for driving the single-/multi-phase load, the load drive circuit characterized in that:

each of the series circuit comprises:

a current detection transistor receiving the same switching signal as the switching signal supplied to the first transistor to provide a proportional current proportional to the load current; and a buffer circuit having an idling current source for providing a predetermined idling current to the output node of the current detection transistor, the buffer circuit adapted to equalize the output voltage of the first transistor with the voltage at the output node of the current detection transistor, and adapted to output a detection current that amounts to the sum of the proportional current and the idling current, and characterized in that the load drive circuit further comprises a conversion circuit for collectively converting into an output signal the detection currents outputted from the respective buffer circuits.

A load drive circuit in accordance with a further aspect of the invention has at least two current output circuits to form a single-/multi-phase bridge circuit for driving a single-/multi-phase load, each of the current output circuits including: a current-controlling transistor having a control electrode and an output electrode connected together; a variable-current type control-current supplying current source for supplying controlled current to the current-controlling transistor; a first transistor connected to the current-controlling transistor in a current mirror configuration and provided between a first power supply voltage and the output node of the load drive circuit supplying load current to the load; and a second transistor connected between the output node and a second power supply voltage and configured to be switched on and off by a switching signal, the load drive circuit characterized in that each of the current outputting circuit comprises, in association with the first transistor thereof:

a current detection transistor, connected to the current-controlling transistor in a current mirror configuration for supplying a proportional current that is proportional to the load current; and a buffer circuit having an idling current source for providing a predetermined idling current to the output node of the current detection transistor, the buffer circuit adapted to equalize the output voltage of the first transistor with the voltage at the output node of the current detection transistor, and adapted to output a detection current that amounts to the sum of the proportional current and the idling current, and characterized in that the load drive circuit comprises a conversion circuit for collectively converting the detection currents outputted from the respective buffer circuits into an output signal.

The buffer circuits may have: an amplifier fed with the output voltage of the first transistor and the voltage appearing at the output node of the current detection transistor, and a third transistor provided between the output node of the current detection transistor and conversion circuit, and controlled by the output of the amplifier.

The load drive circuit may further comprise:

a switching circuit provided in the idling current source;

a comparator for generating a comparison output when the output signal exceeds the reference level, to thereby switch off the switching circuit by the comparison output.

The load drive circuit may further comprise: a switching circuit provided in the idling current source and switched on by an idling signal; and a timing circuit for outputting the idling signal for a first predetermined period of time upon receipt of the control command signal and for outputting the control signal after a second predetermine time has elapsed since the receipt of the control command signal, the second predetermine time being shorter than the first predetermined time.

A memory storage of the invention may comprise any one of the inventive load drive circuits as described above and a motor driven by the load drive circuit.

According to the invention, the first transistor serving as a power transistor and a current detection transistor are supplied with a common (i.e. the same) power supply voltage and a common switching signal, so that the two transistors provide presumably the same virtual output voltage. When these transistors are P-type MOS (PMOS) transistors, their gate and source are connected together, and their drains have presumably the same virtual potential. Thus, as compared with conventional methods of directly measuring load current, the invention enables detection of load current with reduced power consumption using a small current (1/N of the load current) flowing through the current detection transistor.

Moreover, the load current can be detected even in off-periods of pulse width modulation (PWM) of a bridge-type load drive circuit. That is, load current can be continuously detected in spite of the fact that the load current is controlled by PWM.

In accordance with the present invention, there is provided a variable-current type control-current supplying current source for flowing controlled current through a current-controlling transistor whose control electrode and output electrode are connected together. The current-controlling transistor is connected to the first transistor serving as a power transistor and a current detection transistor in a current mirror configuration. The first transistor and the current detection transistor are fed with a common power supply voltage and a common control voltage, thereby outputting presumably the same virtual output voltage. When these transistors are PMOS transistors, their gate and source are connected together, and their drains have presumably the same virtual potential. As a consequence, utilizing a small current (1/N of the load current) flowing through the current detection transistor, the invention enables detection of the load current with reduced power consumption as compared with conventional direct detection method.

It is noted that the load current can be set to a predetermined level by controlling the level of the current supplied from the control-current supplying current source in accordance with the output signal of the conversion circuit. Therefore, if an error exists in the current mirror ratio of the current-controlling transistor to the first transistor, it would not affect the level of the load current. Thus, the dimensions of the current-controlling transistor can be greatly reduced (by a factor of 1000 for example) as compared with the dimensions of the first transistor.

Unlike PWM driven load drive circuits, the load current of the invention is controlled by continuously controlling the electric conductivity of the first transistor, so that the load current can be detected continuously if the load drive circuit has a bridge configuration.

In addition, the buffer circuit may have an idling current source for supplying predetermined idling current to the output node of the current detection transistor to equalize the output voltage of the first transistor with the voltage at the output node of the current detection transistor and output a detection current that amounts to the sum of the proportional current and the idling current, so that the buffer circuit functions as a Class-A amplification circuit. Thus, stable current detection can be attained even in the initial stage of switching on of the first transistor. Such stable current detection can be also attained in the initial stage of the current control operation of the current-controlling transistor and in the event of a small load current. Furthermore, it should be noted that the linear relationship between the load current and the detection current is improved in the inventive current detection circuit, which facilitates accurate detection of the load current.

It should be also noted that the idling current is cut off when the detection current exceeds a predetermined level or reaches the predetermined level after a certain period of time, which facilitates further reduction of the power consumption.

THE BEST MODE FOR CARRYING OUT THE INVENTION

An inventive current detection circuit, a load drive circuit utilizing the current detection circuit, and a motor driven by the load drive circuit will now be described in detail by way of example with reference to the accompanying drawings.

Figure 1:
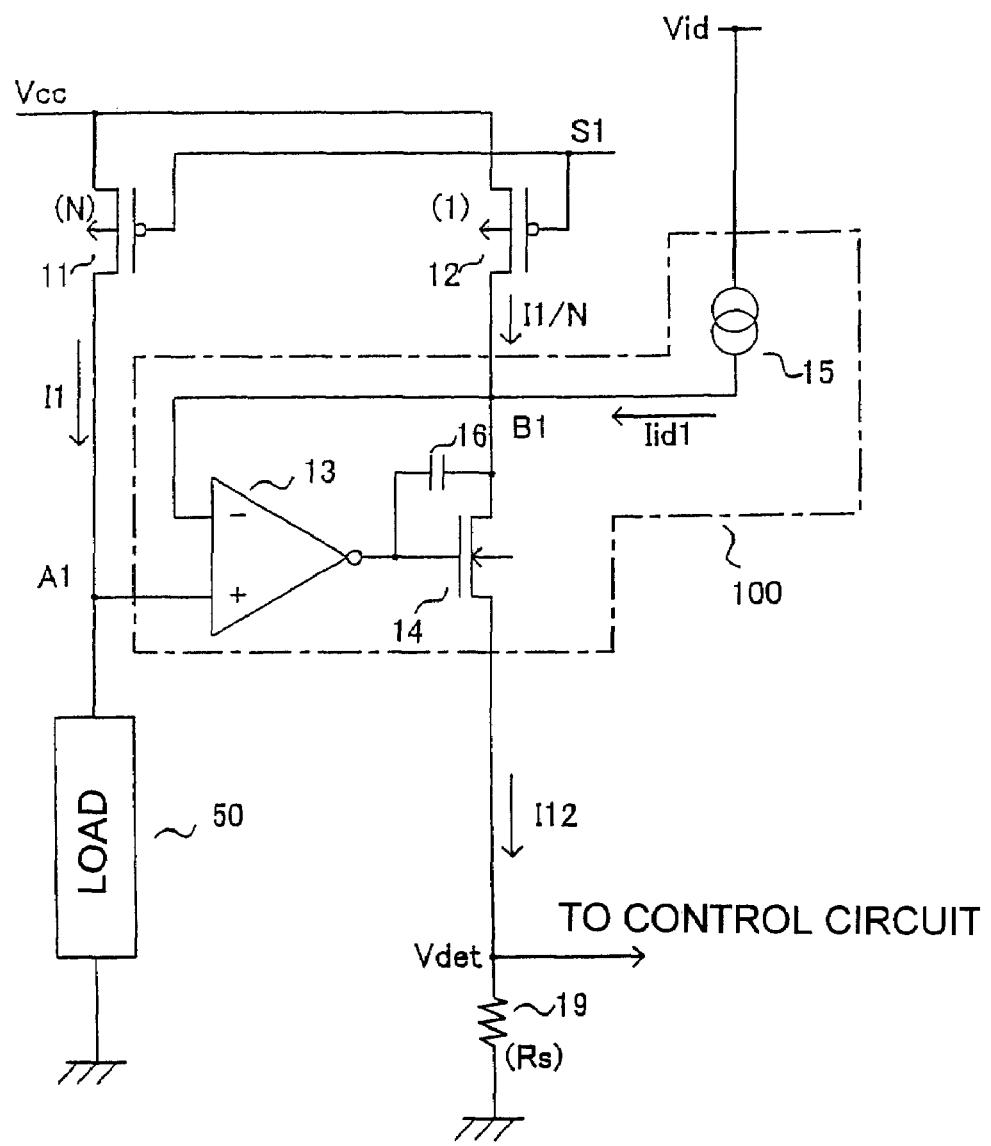
FIG. 1 shows a circuit arrangement of a current detection circuit in accordance with a first embodiment of the invention.

Referring to FIG. 1, there is shown a current detection circuit in accordance with a first embodiment of the invention. Since this current detection circuit is adapted to drive a load, the circuit can be said to be a load drive circuit or a load drive.

As shown in FIG. 1, a first transistor 11 in the form of a PMOS transistor (hereinafter referred to as PMOS first transistor 11) is connected in series with a load 50, between a first power supply voltage Vcc and the ground. The first transistor 11 is turned on when a switching signal S1 (at L level) is fed to the gate thereof, whereby load current (or output current) I1 is allowed to flow through it. Incidentally, it should be understood that voltages would hereinafter represent potentials relative to the ground unless otherwise stated.

The dimensions of the current detection transistor 12, that is, the channel width W and the channel length L, are reduced to 1/N of the corresponding dimensions of the first transistor 11, so that if the same first power supply voltage Vcc and the switching signal S1 are applied to the source and the gate, respectively, of the transistor 12 as applied to the transistor 11, a current (referred to as proportional current) of magnitude I1/N of the load current I1 will flow through the transistor 12. In actuality, however, in most cases the drain voltage of the current detection transistor 12 is not equal to the drain voltage (output voltage) of the first transistor 11. In such cases, a proportional current having a magnitude of exactly I1/N cannot be obtained.

In the present invention, there is provided a specific buffer circuit 100 for equalizing the drain voltage of the current detection transistor 12 with the drain voltage of the first transistor 11, which buffer circuit facilitates stable and accurate current detection.

The buffer circuit 100 includes an amplifier 13 (which can be an operational amplifier) receiving the voltage appearing at the output node A1 (drain voltage) of the first transistor 11 and the voltage appearing at the output node B1 (drain voltage) of the current detection transistor 12, and an NMOS third transistor 14 receiving as its control signal the output of the operational amplifier 13. This NMOS transistor 14 is connected between the output node B1 of the current detection transistor 12 and a detection resistor 19. A capacitor 16 is provided as shown to prevent oscillations from occurring.

The buffer circuit 100 includes a current source 15 coupled between an idling power supply voltage Vid and the output node B1, which current source supplies a predetermined idling current Iid1 to the output node B1. The current source 15 is preferably a constant current generator providing a constant idling current Iid1. In order to make the operation of the current source 15 reliable, the idling power supply voltage Vid is preferably higher than the first power supply voltage Vcc, that is, Vid1>Vcc. Alternatively, the first power supply voltage Vcc can be used as the idling power supply voltage Vid.

Outputted from the buffer circuit 100 is a detection current I12 that amounts to the sum of the proportional current I1/N from the current detection transistor 12 and idling current Iid1 from the current source 15.

The detection current I12 flows through the detection resistor 19 to generate a detection voltage (output signal) Vdet which is given by the product of the resistance Rs of the resistor 19 and the detection current I12. The detection resistor 19 serves as a conversion circuit for converting the detection current I12 into the detection voltage Vdet. The detection voltage Vdet is supplied to a control circuit (not shown).

Figure 2:
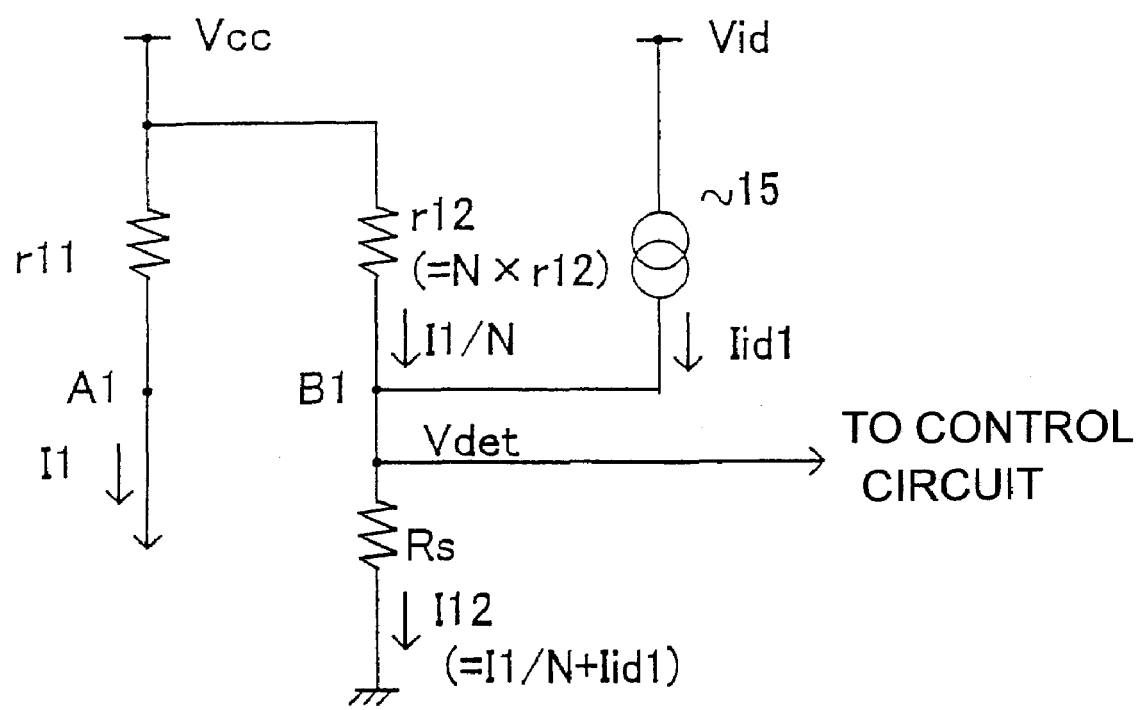
FIG. 2 shows an equivalent circuit for the current detection circuit of FIG. 1.

Operation of the current detection circuit will now be described with reference to an equivalent circuit thereof shown in FIG. 2. The first transistor 11 and the current detection transistor 12 are turned off until they are supplied with a switching signal S1 from the control circuit (not shown). The output node A1 is a point of high-impedance or a node having a LOW voltage (of zero Volt for example). That is, the voltage at the output node A1 is lower than the first power supply voltage Vcc and the idling power supply voltage Vid. On the other hand, the voltage at the output node B1 is determined by the idling power supply voltage Vid.

Since the buffer circuit 100 is adapted to equalize the voltage at the output node B1 with the voltage at the output nodes A1, the MOS transistor 14 is then turned on to lower the voltage at the output node B1. With the MOS transistor 14 turned on, the idling current Iid1 flows through the detection resistor 19 as the detection current I12. Since the idling current Iid1 flows even before the switching signal S1 is supplied, the buffer circuit 100 starts to operate as a Class-A amplification circuit as the switching signal S1 is supplied. This idling current Iid1 generates an offset voltage, Rs×Iid1, of the detection voltage Vdet.

As the switching signal S1 is supplied, the first transistor 11 and the current detection transistor 12 turn on, allowing load current I1 to flow through the load 50. This creates a voltage drop across the first transistor 11, which is given by the product of the ON-resistance r11 of the transistor 11 and the load current I1. The voltage at the output node A1 is lower than the first power supply voltage Vcc by the voltage drop I1×r11. Under this condition, the voltage at the output node B1 is controlled by the buffer circuit 100 to become equal to the voltage at the output node A1. The voltage drop across the current detection transistor 12 is given by the product of proportional current I1/N and the ON resistance r12 (=N× r11) of the current detection transistor 12. Thus, the source, gate, and drain voltages of the first transistor 11 become equal to the respective source, gate, and drain voltages of the current detection transistor 12, whereby the proportional current I1/N through the current detection transistor 12 has an anticipated level.

If no idling current Iil1 were available, problems would arise in the initial stage of turning on of the first transistor 11 and the current detection transistor 12, or when the load current I1, hence the proportional current I1/N, is small. For example, the current detection circuit would not be able to operate in a stable condition, nor the 'proportional' current I1/N would not be exactly proportional to the load current I1.

According to the invention, however, the idling current Iid1 is supplied prior to turning on the first transistor 11 and the current detection transistor 12, causing the buffer circuit 100 to operate as a Class-A amplification circuit. As a consequence, the current detection circuit can operate in a stable condition not only in an initial stage of turning on of the first transistor 11 and the current detection transistor 12, but also in the event of small load current I1, and hence of small proportional current I1/N. In addition, the linear relationship between the load current and the detection current gets improved accordingly, which permits highly accurate detection of the load current.

It should be understood that each of the PMOS first transistor 11 and PMOS current detection transistor 12 could be replaced by an NMOS transistor. Similarly, the NMOS transistor 14 can be replaced by a PMOS transistor or by a bipolar transistor.

Figure 3:
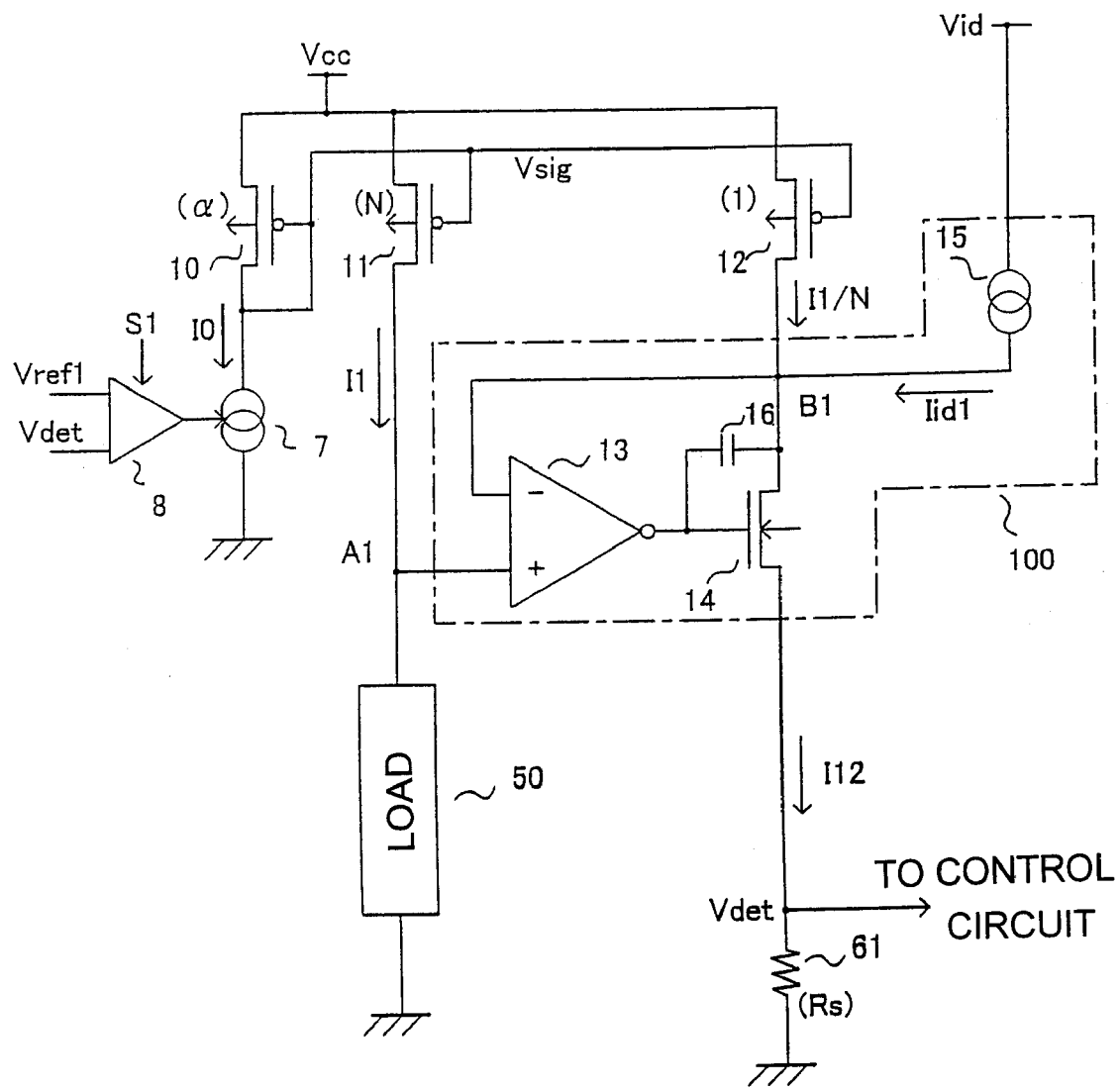
FIG. 3 shows a circuit arrangement of a current detection circuit in accordance with a second embodiment of the invention.

Referring to FIG. 3, there is shown a current detection circuit in accordance with a second embodiment of the invention. As shown in FIG. 3, the first transistor 11 in the form of a PMOS transistor (PMOS first transistor 11) and the current detection transistor 12 in the form of PMOS transistor (PMOS current detection transistor 12) are controlled by a control voltage Vsig of an arbitrary magnitude. In this sense this example differs from the one as shown in FIG. 1. Other features of the circuit detection circuit shown in FIG. 3 are the same as in FIG. 1. Therefore, further description will be given with an emphasis on the differences between them.

As shown in FIG. 3, the PMOS first transistor 11 is connected in series with the load 50 between a first power supply voltage Vcc and the ground so as to provide the load 50 with load current I1. The PMOS current detection transistor 12 is provided to supply a proportional current I1/N that is proportional to the load current I1.

A current-controlling PMOS transistor 10 has a gate serving as a control electrode and a drain connected to the gate and serving as an output electrode. This transistor is connected in series to a variable-current type control-current supplying current source 7, between the first power supply voltage Vcc and the ground.

The gate of the current-controlling transistor 10 is connected to the gates of the first transistor 11 and the current detection transistor 12 in a current mirror configuration. The gate voltage of the current-controlling transistor 10 provides the control voltage Vsig. That is, the current-controlling transistor 10, first transistor 11, and current detection transistor 12 together compose a current mirror circuit, so that the load current I1 through the respective first transistor 11 and the proportional current I1/N through the current detection transistor 12 are proportional to the control current I0 through the current-controlling transistor 10. It should be noted here that the dimensions of the current-controlling transistor 10 in term of the channel width W and the channel length L are made extremely small (by a factor of 1/1000 for example) as compared to the dimensions N of the first transistor 11.

The current source 7 is fed with the error output of an error amplifier 8 amplifying the difference between the detection voltage (output signal) Vdet and a reference voltage Vref1. The magnitude of the current supplied by the current source 7, i.e. the control current I0, is thus controlled by the error output.

The error amplifier 8 is enabled by a switching signal S1 to generate an error output in accord with the difference between the two inputs. It is noted that the control current I0 of the current source 7 is cut off when the switching signal S1 is not supplied, because no error output is generated then. The switching signal S1 may alternatively be supplied to the current source 7 to directly control the on-off operation of the current source 7.

Operation of the current detection circuit of FIG. 3 will now be described. The error amplifier 8 does not generate an error output until a switching signal S1 is supplied thereto from a control circuit (not shown), so that the current source 7 remains turned off until then, thereby zeroing the control current I0. As a consequence, under this condition, the current-controlling transistor 10, first transistor 11, and current detection transistor 12 are all turned off, and hence the load current I1 and proportional current I1/N are zero.

As a switching signal S1 is supplied to the error amplifier 8, the error amplifier 8 will generate an error output in accord with the difference between the reference voltage Vref1 and the detection voltage Vdet. The current source 7 provides control current I0 that flows through the current-controlling transistor 10, in accord with the error output. This control current I0 generates a control voltage Vsig at the gate of the current-controlling transistor 10. The control voltage Vsig is applied to the gates of the first transistor 11 and the current detection transistor 12, thereby enabling the current-controlling transistor 10, first transistor 11, and current detection transistor 12 to operate together as a current mirror circuit.

Through the first transistor 11, and hence through the load 50 also, flows a load current I1 in accordance with a current mirror ratio of the first transistor 11 to the current-controlling transistor 10. Accordingly, a voltage in accord with the electric conductivity of the first transistor 11 and the load current I1 is generated at the drain thereof, i.e. at the output node A1. Meanwhile, the drain voltage of the current detection transistor 12, i.e. the voltage at the output node B1, is controlled by the buffer circuit 100 to become equal to the voltage at the output node A1. The voltage drop across the current detection transistor 12 is determined by the proportional current I1/N and the electric conductivity of the current detection transistor 12. As a consequence, the first transistor 11 and the current detection transistor 12 will have the same sauce voltage, same gate voltage, and same drain voltage, thereby bringing the proportional current I1/N through the current detection transistor 12 to a predetermined level.

It is noted that the detection voltage Vdet obtained from the detection current I12 is fed back to the control circuit so as to maintain the detection voltage Vdet at the predetermined level (reference voltage Vref1). Thus, so long as the current mirror ratio of the first transistor 11 to the current detection transistor 12 is maintained within a certain range of accuracy, operation of the current detection circuit, including current detection operation thereof, will be little affected by the inaccuracy of the current mirror ratio of the current-controlling transistor 10 to the first transistor 11 (and to the current detection transistor 12). For this reason, the current-controlling transistor 10 can be significantly reduced in dimension (by a factor of 1/1000 for example) as compared with the first transistor 11. Accordingly, the current capacity of the current source 7 can be significantly reduced.

It is shown in FIG. 3 that the detection voltage Vdet is set to a predetermined level by a feedback control. However, the invention is not limited to this example. For example, the control voltage Vsig can be set to a predetermined level by a feed-forward control. Such feed-forward control may be implemented by removing the error amplifier 8 of FIG. 3 to supply a predetermined command signal directly to the current source 7, or by removing the current-controlling transistor 10, current source 7, and error amplifier 8 to apply a predetermined control voltage Vsig to the gates of the first transistor 11 and the current detection transistor 12. The same is true with other embodiments.

Figure 4:
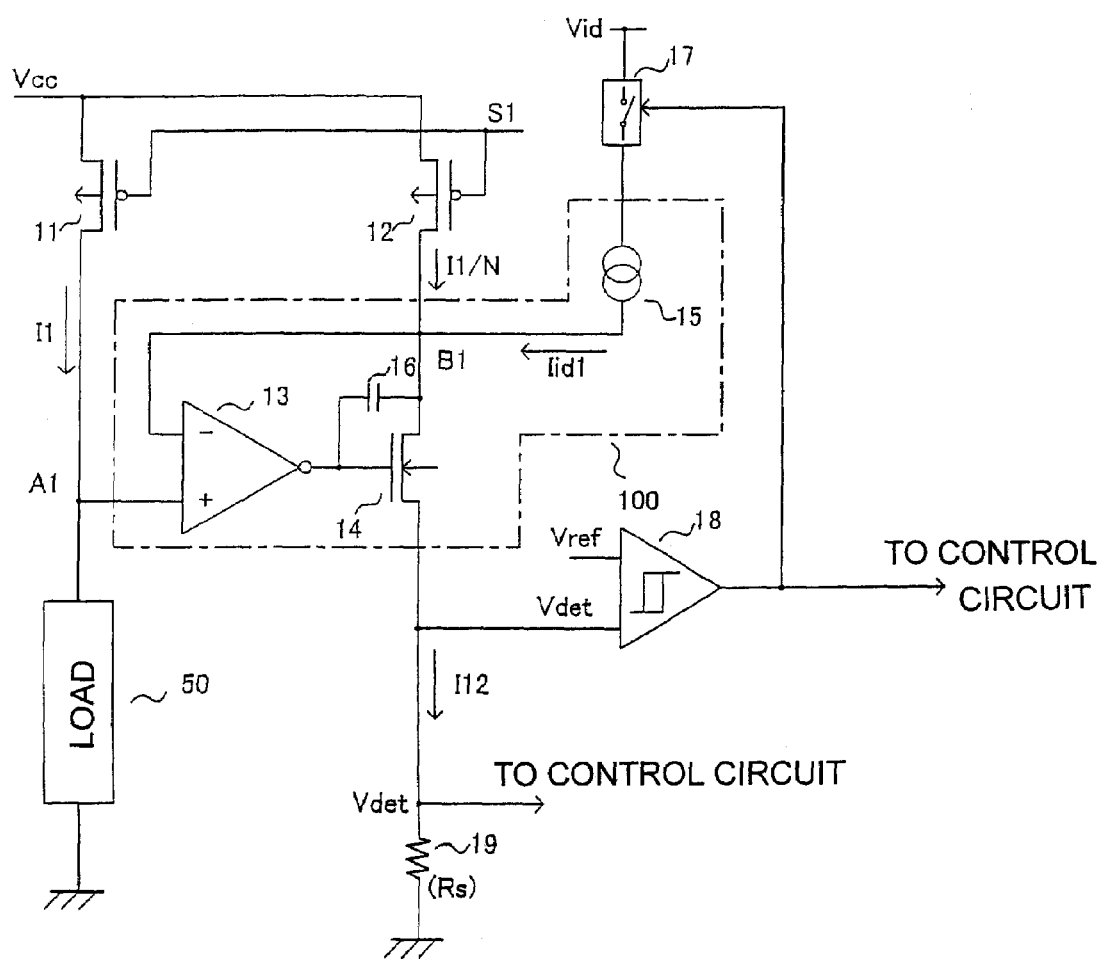
FIG. 4 shows a circuit arrangement of a current detection circuit in accordance with a third embodiment of the invention.
Figure 5:
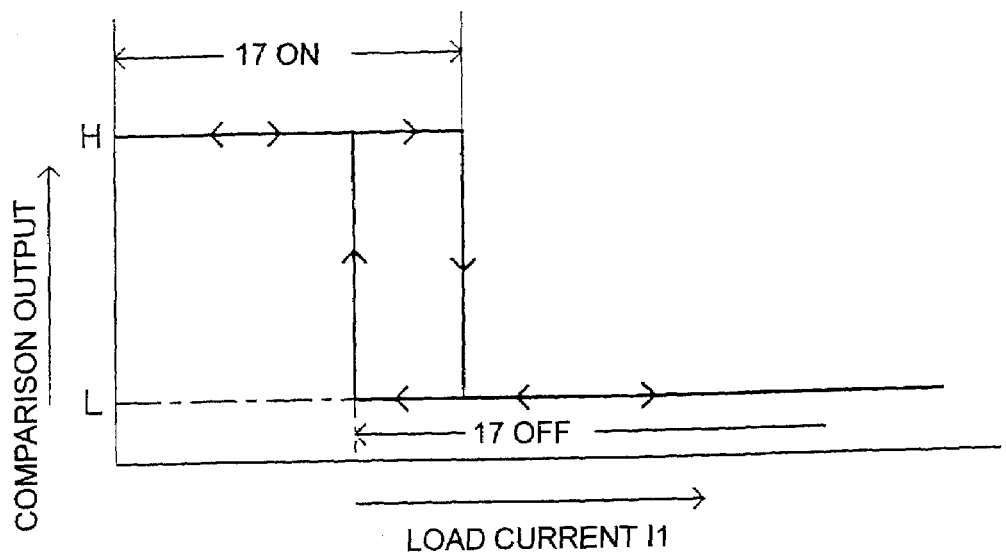
FIG. 5 is a diagram depicting characteristics of the circuit of FIG. 4.
Figure 6:
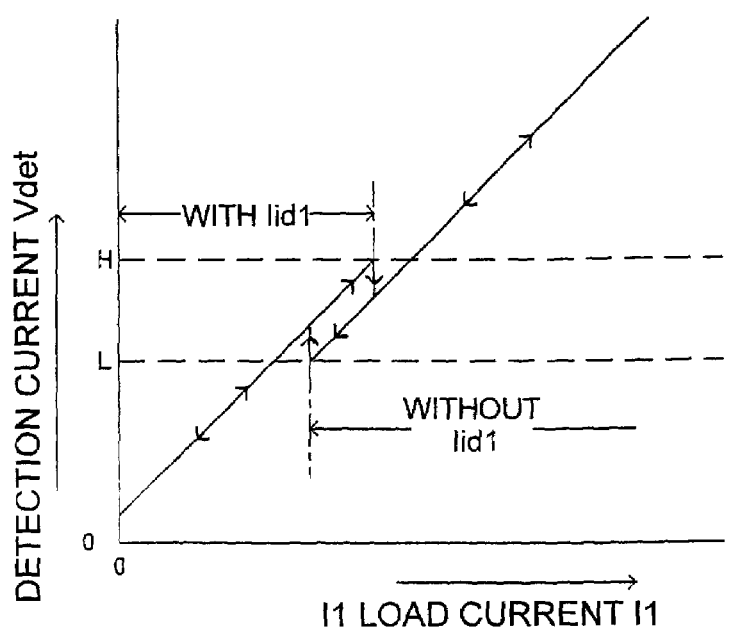
FIG. 6 is another diagram further depicting the characteristics of the circuit of FIG. 4.

Referring to FIG. 4, there is shown a current detection circuit in accordance with a third embodiment of the invention. FIGS. 5 and 6 are diagrams illustrating characteristics of the current detection circuit shown in FIG. 4. The current detection circuit of FIG. 4 is configured to stop supplying idling current Iid1 according to the level of the detection current.

The current detection circuit of FIG. 4 differs from the one shown in FIG. 1 in that a switching circuit 17 is provided, along with the current source 15, between the idling power supply voltage Vid and the output node B1, and that a comparator 18 is provided to generate a comparison output for switching off the switching circuit 17 when, upon comparison of the detection voltage Vdet with the reference voltage Vref, the former voltage exceeds the latter voltage. Alternatively, the current source 15 can be turned on/off by the comparison output of the comparator 18 when for example the current source 15 constitutes a current mirror circuit. In this case, the switching circuit 17 can be removed.

Operation of the third embodiment will now be described with reference to FIGS. 4-6. The switching circuit 17 is turned on prior to supplying a switching signal S1 to the first transistor 11 and the current detection transistor 12. As a switching signal S1 is supplied, the first transistor 11 and the current detection transistor 12 will be turned on in the manner as described in connection with FIG. 1, which results in a detection current I12 that amounts to the sum of the proportional current I1/N from the current detection transistor 12 and the idling current Iid1 from the current source 15.

The comparator 18 compares the detection voltage Vdet generated by the detection current I12 with the reference voltage Vref. The detection voltage Vdet contains an offset voltage associated with the idling current Iid1. The detection voltage Vdet reduces to this offset voltage when the load current I1 is zero. The detection voltage Vdet increases with the load current I1. When the detection voltage Vdet exceeds the reference voltage Vref, the comparison output of the comparator 18 is inverted to turn off the switching circuit 17. The reference voltage Vref is preferably set to a level at which the buffer circuit can perform Class-A amplification operation only with the proportional current I1/N, i.e. without resorting to the idling current Iid1.

When the switching circuit 17 is turned off and the idling current Iid1 goes to zero, the detection voltage Vdet decreases by a voltage (referred to as offset voltage) that amounts to the idling current Iid1. The comparator 18 has a hysteresis of a predetermined width (which is larger than the width associated with the idling current Iid1), so that its output will never undergo hunting.

In order to permit the control circuit to make a judgment as to whether an offset voltage due to idling-current Iid1 is contained in the detection voltage Vdet to be supplied to the control circuit, the comparison output of the comparator 18 is supplied to the control circuit.

It should be noted that, at the stage where the switching circuit 17 is switched off, the proportional current I1/N has already reached a sufficiently large level that does not impede the Class-A amplification operation of the buffer circuit if the idling current Iid1 is turned off, so that the switching off of the circuit 17 presents no problem in the accurate measurement of the detection current. Moreover, the power consumption involved in the current detection can be reduced by cutting off the idling current Iid1.

Figure 7:
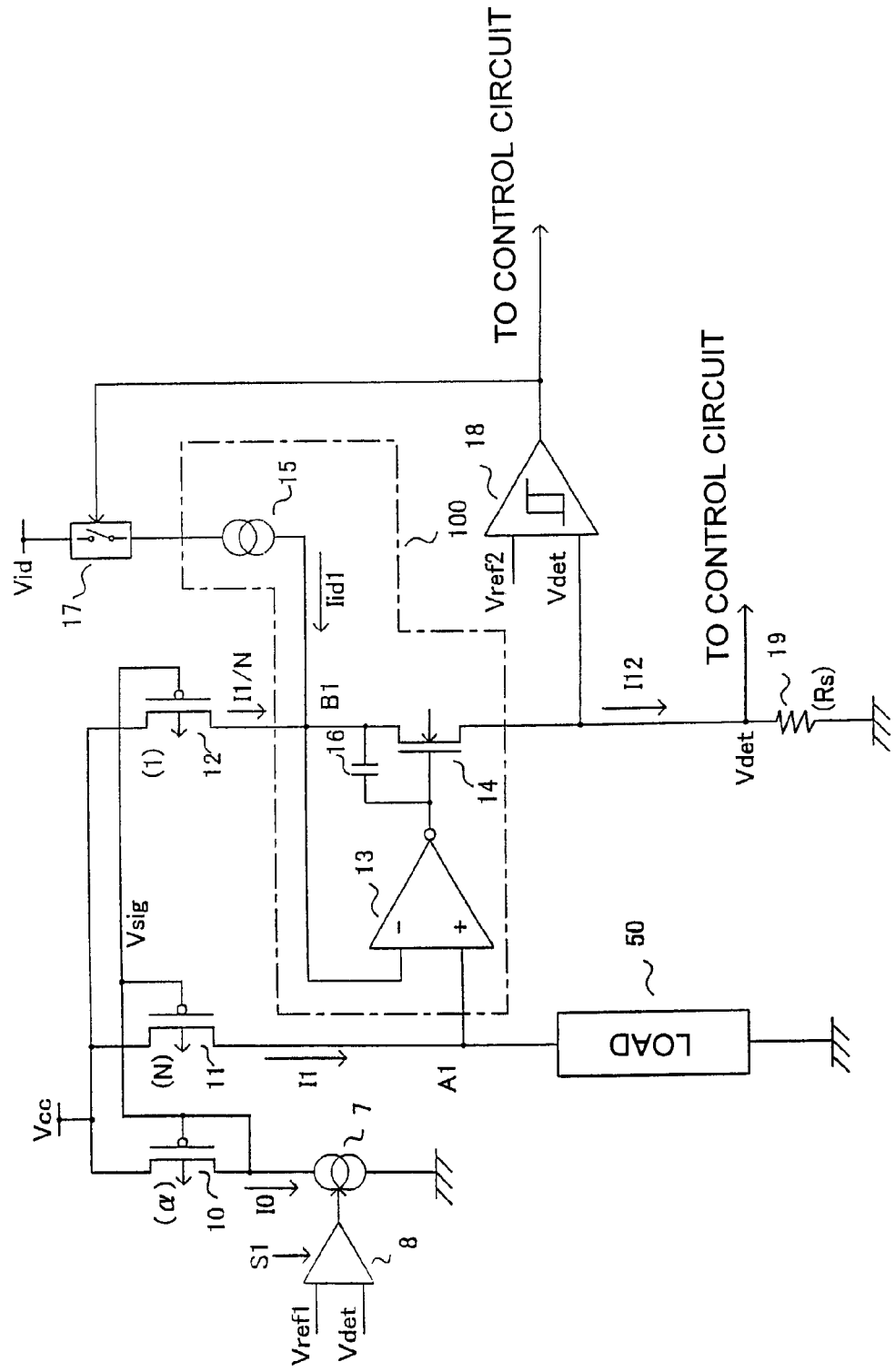
FIG. 7 shows a circuit arrangement of a current detection circuit in accordance with a fourth embodiment of the invention.

Referring to FIG. 7, there is shown a current detection circuit in accordance with a fourth embodiment of the invention. The circuit arrangement shown in FIG. 7 differs from that of FIG. 4 in that the PMOS first transistor 11 and the PMOS current detection transistor 12 are controlled by the control voltage Vsig of an arbitrary magnitude. Other features of the circuit of FIG. 7 are the same as those of FIG. 4.

The manner in which the circuit of FIG. 7 is controlled by the control voltage Vsig is the same as in the second embodiment of FIG. 3.

Figure 8:
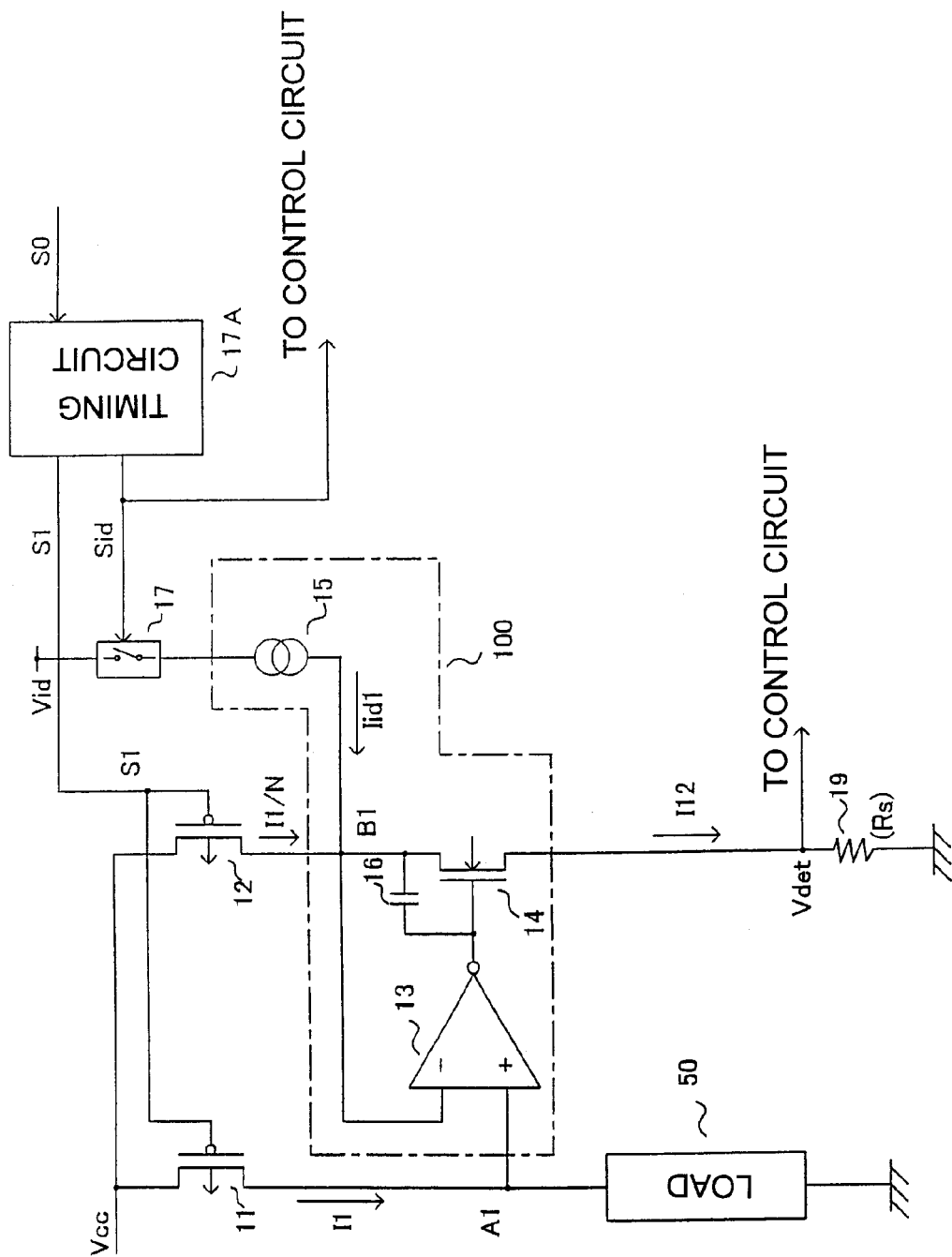
FIG. 8 shows a circuit arrangement of a current detection circuit in accordance with a fifth embodiment of the invention.
Figure 9:
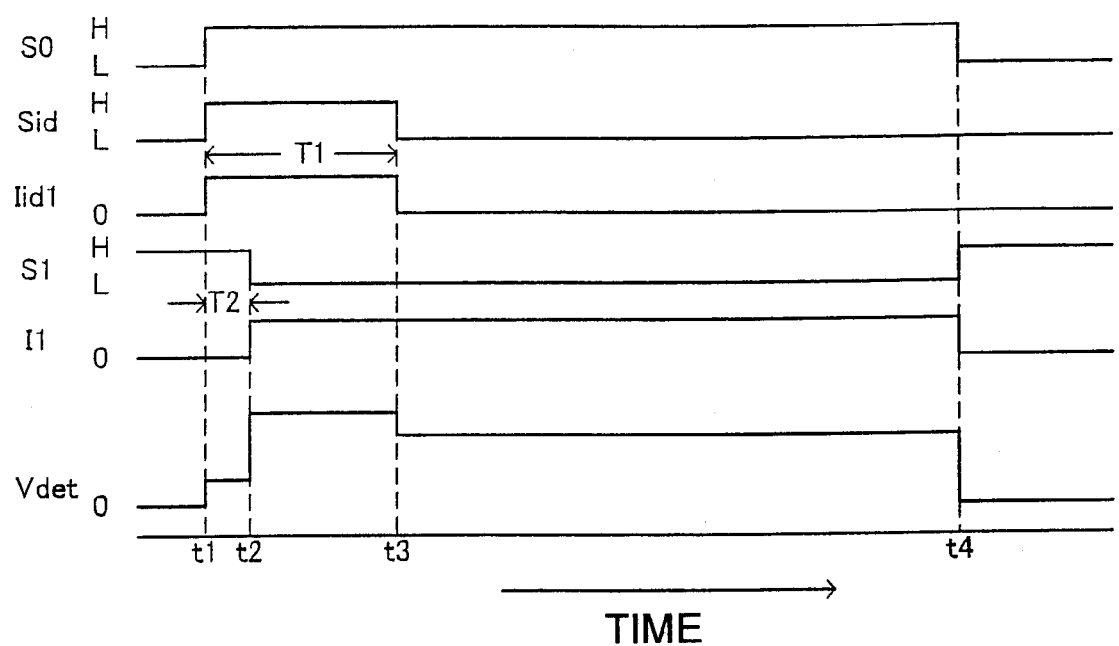
FIG. 9 is a timing diagram illustrating operation of the circuit of FIG. 8.

Referring to FIG. 8, there is shown a current detection circuit in accordance with a fifth embodiment of the invention. FIG. 9 is a timing diagram depicting the operation of the circuit of FIG. 8. In the current detection circuit of FIG. 8, the idling current Iid1 is supplied only for a predetermined period in an early stage of driving the load. The idling current Iid1 is stopped after that period.

The circuit of FIG. 8 differs from the one shown in FIG. 1 in that this circuit is provided with a switching circuit 17, along with a current source 15, between the idling power supply voltage Vid and the output node B1, and with a timing circuit 17A for generating an idling signal Sid and a switching signal S1 in response to an operation instruction signal S0. Alternatively, the current source 15 can be turned on/off by the idling signal Sid when for example the current source 15 constitutes a current mirror circuit. In this case, the switching circuit 17 can be removed.

Referring to FIGS. 8 and 9, operation of the fifth embodiment will now be described. The first transistor 11, current detection transistor 12, and switching circuit 17 are all turned off until an operation instruction signal S0 is supplied to the timing circuit 17A. As an operation instruction signal S0 is supplied to the timing circuit 17A, the timing circuit 17A will promptly generate an idling signal Sid to turn on the switching circuit 17, causing idling current Iid1 to flow. This condition is the same as the condition of the circuit of FIG. 1 before a switching signal S1 is supplied thereto.

Simultaneously with the receipt of the operation instruction signal S0 at time t1, the timing circuit 17A starts measuring lapse time with a counter for example. At time t2, which is a time T2 after time t1, the timing circuit generates a switching signal S1 (at L level) to turn on the first transistor 11 and the current detection transistor 12. As the first transistor 11 and the current detection transistor 12 are turned on, a detection current I12 that amounts to the sum of the proportional current I1/N from the current detection transistor 12 and the idling current Iid1 from the current source 15 results, in a similar manner as described in connection with FIG. 1.

The timing circuit 17A continues measuring the lapse time to stop supplying idling signal Sid at time t3 when period T1 (T1>T2) has elapsed since time t1, to thereby turn off the switching circuit 17. When the operation instruction signal S0 is stopped at time t4, the switching signal S1 will be also stopped (pulled up to H level), thereby stopping the operation of the current detection circuit. This period T1 is preferably set long enough to allow the proportional current I1/N to reach a sufficiently large level which enables the buffer circuit 100 to perform Class-A amplification operation without resorting to the idling current Iid1.

In order to permit the control circuit to make a judgment as to whether an offset voltage due to idling current Iid1 is contained in the detection voltage Vdet to be supplied to the control circuit, the idling signal Sid is supplied to the control circuit.

When the switching circuit 17 is turned off and the idling current Iid1 vanishes, the detection voltage Vdet decreases by a magnitude that amounts to the idling current Iid1. However, at time T1 after the switching circuit 17 was switched off, the proportional current I1/N has reached a sufficiently large level that does not impede the Class-A amplification operation of the buffer circuit if the idling current Iid1 is turned off, so that the switching off of the circuit 17 presents no problem in the accurate measurement of the detection current. Moreover, the power consumption due to the current detection can be reduced by cutting off the idling current Iid1, as in the example shown in FIG. 5.

Figure 10:
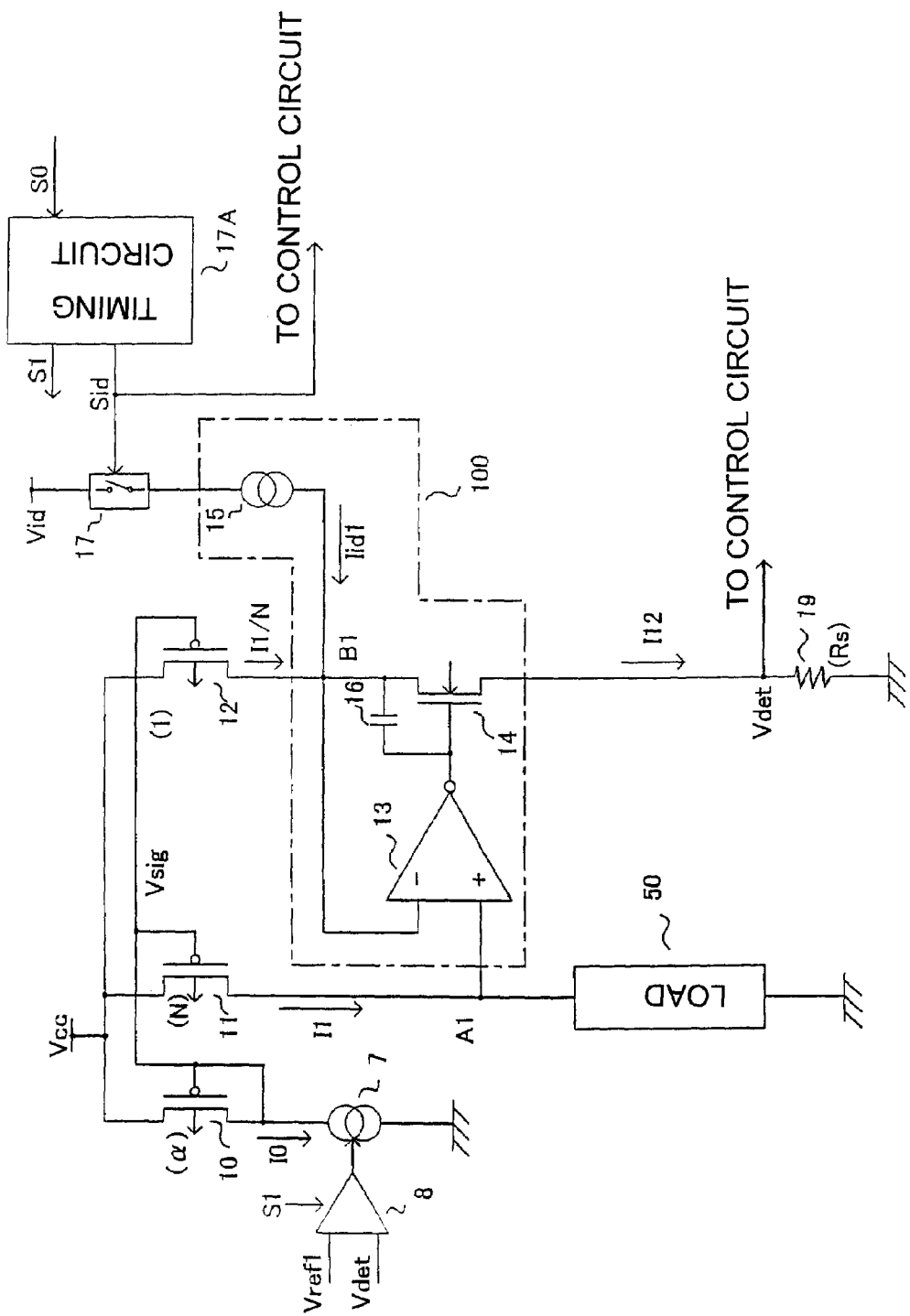
FIG. 10 shows a circuit arrangement of a current detection circuit in accordance with a sixth embodiment of the invention.

Referring to FIG. 10, there is shown a current detection circuit in accordance with a sixth embodiment of the invention. The circuit arrangement shown in FIG. 10 differs from the fifth embodiment shown in FIG. 8 in that the PMOS first transistor 11 and the PMOS current detection transistor 12 are controlled by a control voltage Vsig of an arbitrary magnitude. Other features of the circuit of FIG. 10 are the same as those of FIG. 8.

The manner in which the circuit of FIG. 10 is controlled by the control voltage Vsig is the same as in the second embodiment of FIG. 3.

Figure 11:
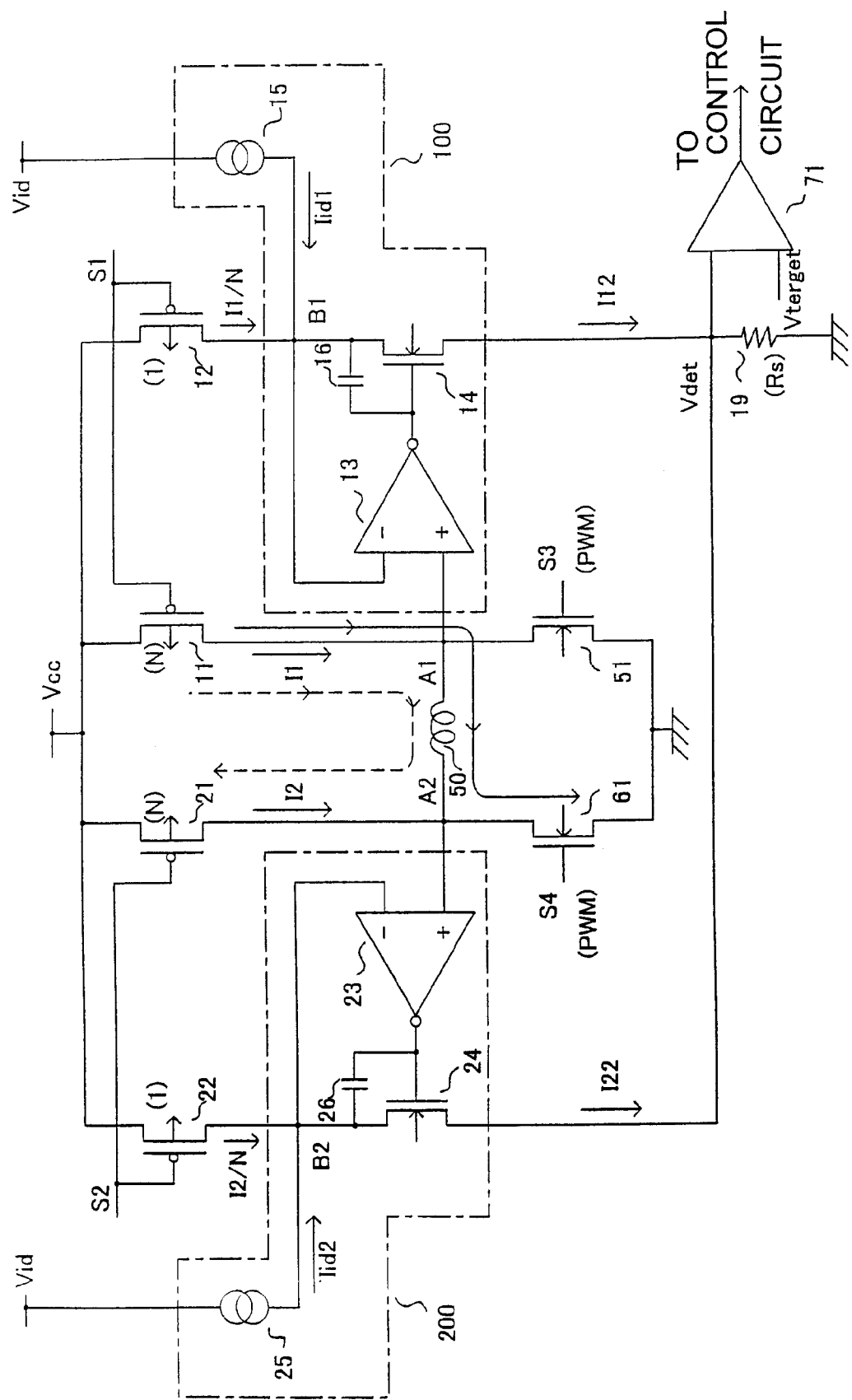
FIG. 11 shows a circuit arrangement of a load drive circuit in accordance with a seventh embodiment of the invention.

Referring to FIG. 11, there is shown a load drive circuit in accordance with a seventh embodiment of the invention for driving a load such as a spindle motor of an HDD and of an FDD.

The load drive circuit of FIG. 11 comprises:
a first series circuit of
a first transistor 11 connected between a first power supply voltage Vcc and an output node A1 coupled to a load 50, said transistor switched on and off by a switching signal S1, and
a second transistor 51 connected between the output node A1 and a second power supply voltage (ground), said transistor switched on and off by a PWM switching signal S3; and
a second series circuit of
a first transistor 21 connected between the first power supply voltage Vcc and an output node A2 connected to the load 50, said second series circuit turned on and off by a switching signal S2, and
a second transistor 61 connected between the output node A2 and the second power supply voltage (ground), said second series turned on and off by a PWM switching signal S4.

FIG. 11 shows an exemplary single-phase bridge circuit having two series circuits each having a first and a second transistors. When this invention is applied to a 3-phase bridge circuit, the number of series circuits each having a first and a second transistors is 3. A multi-phase bridge circuit having more than three phases may be obtained in a similar way.

In a load drive circuit incorporating a single-phase or a multi-phase bridge circuit formed of more than one such series circuits as described above for performing PWM driving of a single- or a multi-phase load, current detection circuits (100, 200) may be provided phase-wise (i.e. one for each phase), with each current detection circuit configured to incorporate one first transistor (11, 21), as shown in FIG. 11.

In this case, current detection transistor (12) is provided to receive the same switching signal (S1) as inputted to the associated first transistor (11). For example, the current detection transistor 12 supplies a proportional current I1/N proportional to the load current I1 flowing through the first transistor 11. A buffer circuit 100 has a current source 15 for supplying a predetermined idling current Iid1 at the output node B1 of the current detection transistor 12. The buffer circuit 100 equalizes the voltage at the output node A1 of the first transistor 11 with the voltage at the output node B1 of the current detection transistor 12, and outputs a detection current I12 that amounts to the sum of the proportional current I1/N and idling current Iid1. A buffer circuit 200 also has the same components as the buffer circuit 100, which are referred to by different but corresponding reference numerals (for example, 12 in correspondence with 22).

This load drive circuit is provided with a detection circuit (detection resistor) 19 for collectively converting the detection currents I12 and I22 from the buffer circuits 100 and 200 of the respective series circuits into a detection voltage (output signal) Vdet. The drive circuit is also provided with an error amplifier 71 for comparing the detection voltage Vdet with an inputted command value Vtarget instructing the speed or torque of the load and for outputting an error signal indicative of the difference between the two inputs. This error signal is supplied to a control circuit (not shown) controlling the load such as a motor.

Looking at the load drive circuit of this single-phase bridge circuit shown in FIG. 11, operation of the circuit detecting the load currents I1 and I2 through the first transistors 11 and 21 is the same as that of the circuit shown in FIG. 1. However, unlike the load drive circuit of FIG. 1, this load drive circuit has a feature that it performs PWM driving of a load. Relevant aspects of this feature will now be described.

In the arrangement shown in FIG. 11, there can be two cases. In the first case, the transistor 11 is turned on while the second transistor 61 is turned on and off by a PWM switching signal S4. In the second case, the first transistor 21 is turned on while the second transistor 51 is turned on and off by a PWM switching signal S3.

Consider the first case where the first transistor 11 is turned on and the second transistor 61 is turned on and off by the PWM switching signal S4. In this case, when the second transistor 61 is turned on, load current I1 flows from the first power supply voltage Vcc to the ground through the first transistor 11, load 50, and the second transistor 61, as indicated by a solid flow line. On the other hand, when the second transistor 61 is turned off by a PWM signal during an off period of PWM, load current I1 flows from the first transistor 11 to the load 50, a parasitic diode of the first transistor 21, and back to the first transistor 11, as indicated by a broken flow line.

It will be recalled that the load current I1 during off periods of PWM cannot be measured by a conventional direct detection method utilizing a resistor. However, in the present invention, so long as load current I1 is flowing through the first transistor 11, it can be continuously measured by measuring the proportional current I1/N even in off-periods of PWM, not to say in the on-periods. The same is true in the converse case where the first transistor 21 is turned on and the second transistor 51 is switched on and off by the PWM switching signal S3.

When, for example, the speed of the spindle motor of a memory storage is controlled by the load drive circuit of FIG. 11, the command value Vtarget is a command torque value. The command torque value Vtarget is determined by the difference between the motor speed set for the spindle motor (the speed referred to as spindle motor speed setting value) and the actual motor speed.

To carry out speed control of a spindle motor in a stable condition, the change in detection current, or detection voltage Vdet, is preferably continuous. Thus, once the speed control of the spindle motor is started, idling current Iid1 and Iid2 are preferably flown continuously, without being interrupted. It is noted that even if the idling currents Iid1 and Iid2 flow continuously, they do not affect the load currents I1 and I2 due to the fact that the idling currents Iid1 and Iid2 are themselves constant.

By continuously flowing the idling currents in this manner, highly stable motor speed control can be maintained.

It is also noted that even when the spindle motor is stopped the idling currents Iid1 and Iid2 are kept flowing to generate a fixed offset voltage, which is contained in the detection voltage Vdet, whereas the command torque value is zero. Since in this case the command torque value Vtarget is smaller than the detection voltage Vdet by the offset voltage, the driving force (torque) acting on the stationary motor can be certainly reduced to zero.

It should be understood that without implementing any offset voltage based on the idling currents Iid1 nor Iid2, noise could affect the command torque value Vtarget, possibly generating a torque on the motor. However, uninterrupted idling currents generate an offset voltage, which prevents accidental rotational motion of the motor from occurring in a noisy environment. Such accidental operation of the motor is not limited to the motor speed control, but it may occur in other types of control (such as current control) of the motor.

Furthermore, in the seventh embodiment shown in FIG. 11, it is also possible to have the idling currents Iid1 and Iid2 controlled to flow through either one of the first transistors 11 or 21. This flow control of the idling currents can be attained by generating, in association with the generation of the switching signals S1 and S2 from the control circuit, a control signal for controlling the idling currents Iid1 and Iid2. For example, the current sources 15 and 25 are preferably turned off in association with the switching signals S1 and S2.

It should be understood that the load drive circuit of FIG. 11 may be provided phase-wise with a further control circuit (referred to as idling current off-control circuit) for controllably turning off the idling current using a switching circuit 17 and a comparator 18 as used in the third embodiment shown in FIG. 4, or with a further timing control circuit for controlling the timing of the idling currents using a switching circuit 17 and a timing circuit 17A as used in the fifth embodiment shown in FIG. 8. In these cases, the switching circuits 17 provided in the respective drive circuits are preferably turned on or off simultaneously by the comparison output of the comparator 18 (as shown in FIG. 4), or by the idling signal Sid from the timing circuit 17A (as shown in FIG. 8).

Such on-off control of the idling currents Iid1 and Iid2 in accordance with the on/off states of the first and second transistors 11 and 21, or off-control of the idling currents Iid1 and Iid2 in accordance with the detection voltage Vdet or elapsed time as shown in FIGS. 4 and 8, is suitable for use in, for example, accurate detection of load currents I1 and I2 of a stepping motor which is necessary for the current control thereof. In such current control of a motor as described above, the command value Vtarget is a command current value.

Figure 12:
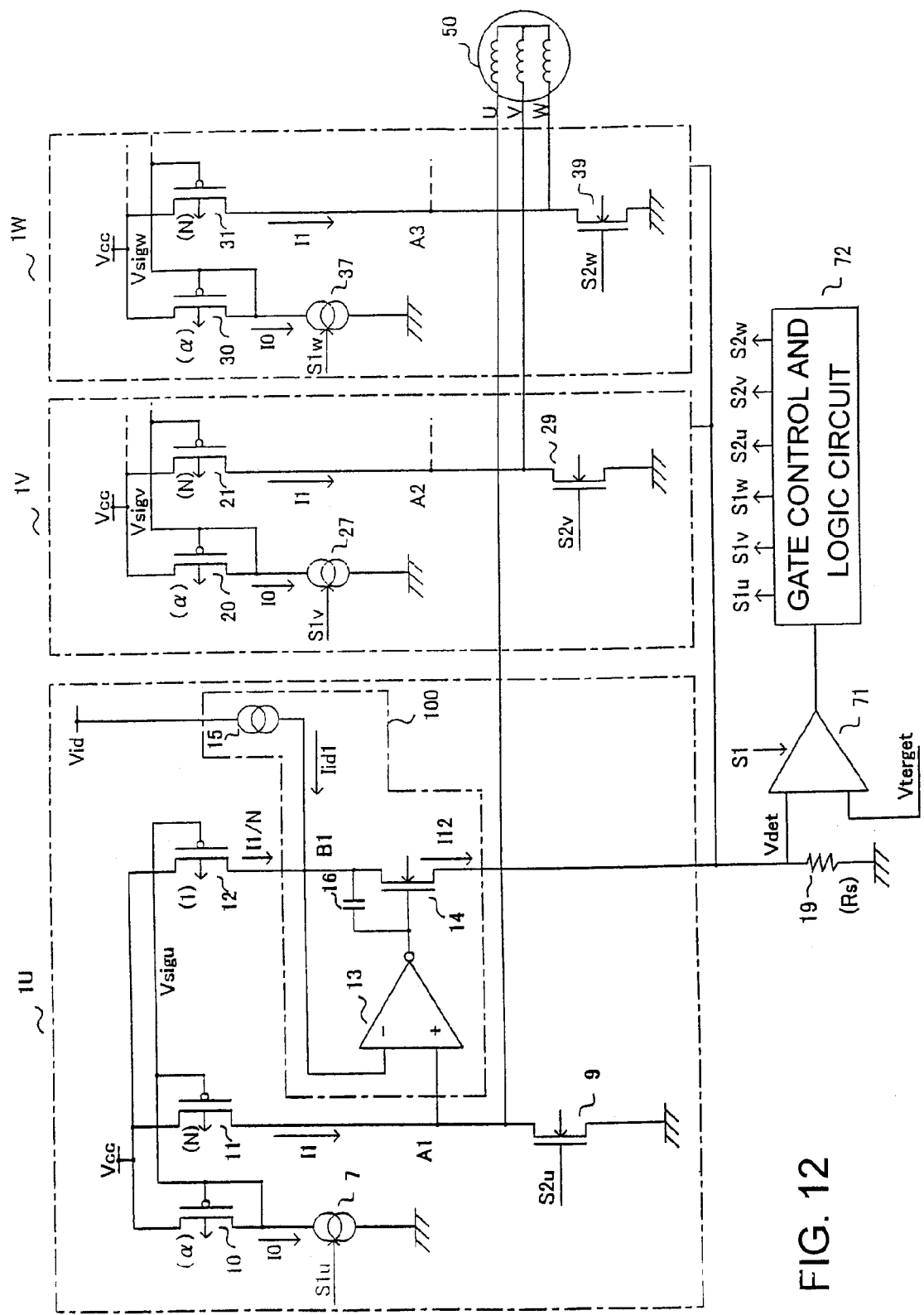
FIG. 12 shows a circuit arrangement of a load drive circuit in accordance with an eighth embodiment of the invention.

FIG. 12 shows a load drive circuit for driving a load such as a spindle motor of an HDD and of an FDD in accordance with an eighth embodiment of the invention.

The load drive circuit of FIG. 12 is an example of a three-phase bridge circuit for driving a three-phase spindle motor 50. This load drive circuit has a U-phase, a V-phase, and a W-phase drive circuits 1U, 1V, and 1W, respectively.

As compared with the second example shown in FIG. 3, the U-phase drive circuit 1U differs in that a U-phase control signal S1u is supplied to a control-current supplying current source 7, and, in association with the U-phase control signal being supplied, a control voltage Vsigu is supplied to the gates of the first transistor 11 and the current detection transistor 12;

a second transistor 9 is connected between the output node A1 and the ground;

a U-phase switching signal S2u is supplied to the gate of the second transistor 9; and the output node A1 is connected to the coil terminal U of the 3-phase spindle motor 50. Other features of the load drive circuit are the same as those of FIG. 3.

Although the V-phase and W-phase drive circuits 1V and 1W, respectively, are shown only partially in FIG. 12, they have basically the same arrangement as the U-phase drive circuit, with like elements referred to by different, but corresponding, reference numerals. That is, as compared with the second example shown in FIG. 3, this example differs in that a V-phase and a W-phase control signals, S1v and S1w, respectively, are supplied to associated control-current supplying current sources 27 and 37, and, in association with these control signals, control voltages Vsigv and Vsigw are respectively supplied to the associated gates of the first transistors 21 and 31;

second transistors 29 and 30 are respectively connected between the associated output nodes A2 or A3 and the ground;

a V-phase and a W-phase switching signals, S2v and S2w, respectively, are supplied to the associated gates of the second transistors 29 and 39; and the output nodes A2 and A3 are respectively connected to the associated V-phase and W-phase coil terminals, V and W, respectively, of the 3-phase spindle motor 50.

Detection currents I12, etc. obtained from the respective drive circuits 1U, 1V, and 1W are integrally supplied to the detection resistor 19.

The error amplifier 71 compares the inputted command value Vtarget instructing the speed and torque of the motor or load current with the inputted detection voltage Vdet and supplies an error signal indicative of the difference between the two inputs to a gate-controlling logic circuit 72. The error amplifier 71 is operable when it is supplied with a switching signal S1. Alternatively, the switching signal S1 may be supplied to the gate-controlling logic circuit 72.

As a switching signal S1 is supplied to the error amplifier 71, the gate-control and logic circuit 72 generates control signals S1u, S1v, S1w and switching signals S2u, S2v, and S2w for the respective phases in accordance with a logic governing the 3-phase driving of the motor. (The logic will be referred to as 3-phase logic.) The 3-phase control signals S1u, S1v, S1w are respectively supplied to the associated control-current supplying current sources 7, 27, and 37, and the 3-phase switching signals S2u, S2v, and S2w are respectively supplied to the associated gates of the second transistors 9, 29, and 39. The 3-phase logic controls the conductivities of the first transistors 11, 21, and 31 so as to supply power to the respective 3-phase terminals U, V, and W of the 3-phase motor 50 in the sequence of, for example, U→V, U→W, V→W, V→U, W→U, W→V, U→V, etc., where U→V for example stands for a stage in which electric power is fed to terminal U and then to terminal W, and at the same time the 3-phase logic switches on/off the second transistor 9, 29, and 39 in turn in the order mentioned. This gate-control and logic circuit 72 may be included in a control circuit (not shown) together with other control sections.

FIG. 12 shows an example of a 3-phase bridge circuit, which has three drive circuits one for each phase. When the present invention is applied to a single-phase bridge circuit, the number of drive circuits is two. In a similar way, the invention is applicable to a multi-phase bridge circuit for more than three phases.

It is noted that the circuit of FIG. 12 exemplifies a load drive circuit having multiple drive circuits one for each phase, forming a single-phase or a multi-phase bridge circuit for linearly driving a single-phase or a multi-phase load, in which drive circuit a current detection circuit similar to the one shown in FIG. 3 is provided for each of the first transistors 11, 21, and 31 that are linearly controlled by a control voltage Vsig, with each current detection circuit including associated one of the first transistors.

In the eighth example shown in FIG. 12, the idling currents Iid1, Iid2, and Iid3 for the respective 3-phase drive circuits 1U, 1V, and 1W preferably have the same magnitude.

When the load drive circuit of FIG. 12 is used to control the speed of a spindle motor of a memory storage for example, the command value Vtarget is a command torque value. This command torque value Vtarget is developed by the difference between the spindle motor speed setting value and the actual speed of the motor.

In controlling the speed of the spindle motor in a stable condition, the change in detection current, or detection voltage Vdet, is preferably continuous. Thus, once the speed control of the spindle motor is started, idling current Iid1 etc. be preferably flown continuously, without being interrupted. It is noted that even if the idling currents Iid1 etc. flow continuously, they do not affect the load current I1, due to the fact that the idling currents Iid1, etc. are themselves constant.

Thus, by flowing the idling currents without interruption, it is possible to maintain high stability of the motor speed control.

It is noted that even when the spindle motor is stopped the idling currents Iid1, etc. are kept flowing to generate a fixed offset voltage, which is contained in the detection voltage Vdet, whereas the command torque value is zero. Since in this case the command torque value Vtarget is smaller than the detection voltage Vdet by the offset voltage, the driving force (i.e. torque) acting on the stationary motor can be certainly reduced to zero.

It should be understood that without implementing any offset voltage based on the idling currents Iid1, etc., noise can affect the command torque value Vtarget, possibly generating a torque on the motor. However, uninterrupted idling current ensures an offset voltage, which will prevent accidental rotational motion of the motor from occurring in a noisy environment. Such accidental operation of the drive circuit is not limited to the speed control of a motor. For example, it may occur in the current control of a motor.

The load drive circuit shown in FIG. 12 may be provided phase-wise with an idling current off-control circuit for controllably turning off the idling current, using a switching circuit 17 and a comparator 18 as used in the fourth embodiment shown in FIG. 7. The drive circuit may be also provided phase-wise with a timing control circuit for controlling the timing of the idling current using a switching circuit 17 and a timing circuit 17A as used in the sixth embodiment shown in FIG. 10. In these cases, the switching circuit 17 provided in each phase-wise drive circuit is preferably turned on and off simultaneously by the comparison output of the comparator 18 (as shown in FIG. 7), or by the idling signal Sid from the timing circuit 17A (as shown in FIG. 10).

Such off-control of the idling currents in accordance with the detection voltage Vdet or elapsed time as described and shown in FIG. 7 or FIG. 10, is suitable for highly accurate detection of the load currents I1 which is necessary, for example, to execute current control of a stepping motor. In such current control of a motor as described above, the command value Vtarget is a command current value.

INDUSTRIAL APPLICABILITY

An inventive current detection circuit and a load drive circuit utilizing the current detection circuit can be used with a spindle motor of a memory storage such as an HDD and an FDD, with a greatly reduced power loss. The current detection circuit, and hence the load drive circuit, enables continuous and accurate detection of the load current in a stable manner with a reduced power loss.

The invention claimed is:

1. A current detection circuit, comprising:
a first transistor arranged to supply load current to a load;
a current detection transistor having a control electrode arranged to receive the same control signal as applied to the control electrode of said first transistor, said current detection transistor arranged to supply a proportional current that is proportional to said load current;
a buffer circuit having an idling current source arranged to supply a predetermined idling current to an output node of said current detection transistor, said buffer circuit arranged to equalize the output voltage of said first transistor with the voltage at said output node of said current detection transistor, and arranged to output a detection current that amounts to the sum of said proportional current and said idling current; and
a conversion circuit arranged to convert said detection current outputted from said buffer circuit into an output signal.

2. A current detection circuit, comprising:
a current controlling transistor having a control electrode and an output electrode connected to said control electrode;
a variable-current type control-current supplying current source arranged to direct controlled current through said current controlling transistor;
a first transistor connected to said current controlling transistor in a current mirror configuration to supply load current to a load;
a current detection transistor connected to said current controlling transistor in a current mirror configuration to supply a proportional current that is proportional to said load current;
a buffer circuit having an idling current source arranged to provide a predetermined idling current to the output node of said current detection transistor, said buffer circuit arranged to equalize the output voltage of said first transistor with the voltage at said output node of said current detection transistor, and arranged to output a detection current that amounts to the sum of said proportional current and said idling current; and a conversion circuit arranged to convert said detection current outputted from said buffer circuit into an output signal.

3. The current detection circuit according to claim 1, wherein said buffer circuit further comprises:
an amplifier arranged to receive the output voltage of said first transistor and the voltage appearing at the output node of said current detection transistor; and
a third transistor provided between said output node of said current detection transistor and said conversion circuit, and controlled by the output of said amplifier.

4. The current detection circuit according to claim 1, wherein the power supply voltage supplied to said idling current source is equal to or higher than the first power supply voltage supplied to said first transistor and said current detection transistor.

5. The current detection circuit according to claim 1, further comprising:
a switching circuit operatively connected to said idling current source;
a comparator arranged to generate a comparison output to switch off said switching circuit when said output signal exceeds a reference level.

6. The current detection circuit according to claim 5, wherein said comparator has a characteristic hysteresis having a predetermined hysteresis width.

7. The current detection circuit according to claim 1, further comprising:
a switching circuit operatively connected to said idling current source; and arranged to be switched on by an idling signal; and
a timing circuit arranged to output said idling signal for a first predetermined period of time upon receipt of said control command signal and to output said control signal after a second predetermined time has elapsed since the receipt of said control command signal, said second predetermined time being shorter than said first predetermined time.

8. A load drive circuit arranged to perform pulse-width-modulated driving of a single-/multi-phase load, said load drive circuit having at least two series circuits such that each of said series circuits includes: a first transistor coupled between a first power supply voltage and the output node connected to said load to supply load current to said load when switched on by a switching signal; and a second transistor coupled between a second power supply voltage and said output node and switched on and off by a pulse-width-modulated switching signal, and that said series circuits together define a single-/multi-phase bridge circuit arranged to drive said single-/multi-phase load, wherein:
each of said series circuits comprises:
a current detection transistor arranged to receive the same switching signal as the switching signal supplied to said first transistor to provide a proportional current proportional to said load current; and
a buffer circuit having an idling current source arranged to provide a predetermined idling current to the output node of said current detection transistor, said buffer circuit arranged to equalize the output voltage of said first transistor with the voltage at said output node of said current detection transistor, and arranged to output a detection current that amounts to the sum of said proportional current and said idling current; and
said load drive circuit further comprises a conversion circuit arranged to collectively convert into an output signal the detection currents outputted from the respective buffer circuits.

9. A load drive circuit having at least two current output circuits defining a single-/multi-phase bridge circuit arranged to drive a single-/multi-phase load, each of said current output circuits including: a current controlling transistor having a control electrode and an output electrode connected to said control electrode; a control-current supplying current source arranged to supply controlled current to said current controlling transistor; a first transistor connected to said current controlling transistor in a current mirror configuration and provided between a first power supply voltage and the output node of said load drive circuit supplying load current to said load; and a second transistor connected between said output node and a second power supply voltage and configured to be switched on and off by a switching signal, wherein:
each of said current outputting circuit comprises, in association with the first transistor thereof:
a current detection transistor, connected to said current controlling transistor in a current mirror configuration to supply a proportional current that is proportional to said load current; and
a buffer circuit having an idling current source arranged to provide a predetermined idling current to the output node of said current detection transistor, said buffer circuit arranged to equalize the output voltage of said first transistor with the voltage at said output node of said current detection transistor, and to output a detection current that amounts to the sum of said proportional current and said idling current; and
said load drive circuit comprises a conversion circuit arranged to collectively convert the detection currents outputted from the respective buffer circuits into an output signal.

10. The load drive circuit according to claim 8, wherein said buffer circuit comprises:
an amplifier arranged to receive with the output voltage of said first transistor and the voltage appearing at the output node of said current detection transistor; and
a third transistor provided between said output node of said current detection transistor and said conversion circuit, and controlled by the output of said amplifier.

11. The load drive circuit according to claim 8, further comprising:
a switching circuit operatively connected to said idling current source;
a comparator arranged to generate a comparison output when said output signal exceeds said reference level, to thereby switch off said switching circuit by said comparison output.

12. The load drive circuit according to claim 8, further comprising:
a switching circuit operatively connected to said idling current source; and arranged to be switched on by an idling signal; and
a timing circuit arranged to output said idling signal during a first predetermined period of time upon receipt of said control command signal and arranged to output said control signal after a second predetermined time has elapsed since the receipt of said control command signal, said second predetermined time being shorter than said first predetermined time.

13. A memory storage comprising:
a load drive circuit in accordance with claim 8; and
a motor arranged to be driven by said load drive circuit.

* * * * *